United States Patent [19]
Babich et al.

[11] Patent Number: 5,830,332
[45] Date of Patent: Nov. 3, 1998

[54] SPUTTER DEPOSITION OF HYDROGENATED AMORPHOUS CARBON FILM AND APPLICATIONS THEREOF

[75] Inventors: Edward D. Babich, Chappaqua; Alessandro Cesare Callegari, Yorktown Heights; Fuad Elias Doany, Katonah; Sampath Purushothaman, Yorktown Heights, all of N.Y.

[73] Assignee: International Business Machines Corporation, Armonk, N.Y.

[21] Appl. No.: 781,080

[22] Filed: Jan. 9, 1997

Related U.S. Application Data

[63] Continuation of Ser. No. 378,848, Jan. 26, 1995, abandoned.

[51] Int. Cl.[6] .................................................. C23C 14/34
[52] U.S. Cl. ............................. 204/192.15; 204/192.26; 204/192.3; 216/12; 216/65
[58] Field of Search .................. 204/192.12, 192.15, 204/192.3, 192.32, 192.34, 192.26, 192.27, 192.28, 192.35; 216/12, 65

[56] References Cited

U.S. PATENT DOCUMENTS

| | | | |
|---|---|---|---|
| 3,840,451 | 10/1974 | Golyanov et al. | 204/192.15 |
| 4,417,946 | 11/1983 | Bohlen et al. | 204/192.34 X |
| 4,486,286 | 12/1984 | Lewin et al. | 204/192.11 |

(List continued on next page.)

OTHER PUBLICATIONS

Burn J. Lin, "The Attenuated Phase–Shifting Mask", Solid State Tech., Jan. 1992, pp. 43–47.

F.D. Kalk et al., "Attenuated Phase Shifting Photomasks Fabricated From CR–Based Embedded Shifter Blanks", Apr. 1994, Digest of Papers, Photomask Japan '94, Japan Chapter of SPIE.

Y. Saito et al., "Attenuated Phase Shift Mask Blanks with Oxide or OXI–Nitride or Cr or MoSi Absorptive Shifter", Apr. 1994, Digest of Papers Photomask Japan '94, Japan Chapter of SPIE.

S. Ito, "Optimization of optical properties for single–layer halftone masks", SPIE vol. pp. 99–110.

F.S. Selwyn et al. "Particle trapping phenomena in radio frequency plasmas", Appl. Phys. Lett. 57 (18) 19 Oct. 1990.

Leybold's Electronics Newsletter, "Metallurgy and Phase Transitions of Co–Alloys", No. 4, Dec. 1993.

K.J. Schulz et al., "AC Reactive Sputter Deposition Process for Hard Carbon Coatings", IBM Technical Disclosure Bulletin, vol. 37, No. 06A, Jun. 1994, pp. 423–424.

A. Callegari et al., "Optical properties of hydrogenated amorphous–carbon film for attenuated phase–shift mask applications", J. Vac. Sci. Technol. B 11(6), Nov./Dec. 1993, pp. 2697–2699.

D.B. Dove et al., "Interferometer for phase measurements in phase shift masks", Proceedings of the SPIE—vol. 1809, 1993, pp. 128–136.

*Primary Examiner*—Nam Nguyen
*Attorney, Agent, or Firm*—Daniel P. Morris

[57] ABSTRACT

The present invention relates to a method of reactive sputtering for depositing an amorphous hydrogenated carbon film (a-C:H) from an argon/hydrocarbon/hydrogen/oxygen plasma, preferably an Ar/acetylene-helium/hydrogen/oxygen plasma. Such films are optically transparent in the visible range and partially absorbing at ultraviolet (UV) and deep UV (DUV) wavelengths, in particular, 365, and 248, 193 nm. Moreover, the films produced by the present invention are amorphous, hard, scratch resistant, and etchable by excimer laser ablation or by oxygen reactive ion etch process. Because of these unique properties, these films can be used to form a patterned absorber for UV and DUV single layer attenuated phase shift masks. Film absorption can also be increased such that these films can be used to fabricate conventional photolithographic shadow masks.

51 Claims, 9 Drawing Sheets

U.S. PATENT DOCUMENTS

| | | | |
|---|---|---|---|
| 4,529,475 | 7/1985 | Okano et al. | 204/298.36 X |
| 4,551,216 | 11/1985 | Argyo | 204/192.15 |
| 4,620,898 | 11/1986 | Banks et al. | 204/298.36 X |
| 4,624,736 | 11/1986 | Gee et al. | 204/192.3 X |
| 4,684,436 | 8/1987 | Burns et al. | 204/192.34 X |
| 4,822,466 | 4/1989 | Rabalais et al. | 204/192.15 |
| 4,851,097 | 7/1989 | Hattori et al. | 204/298.36 |
| 4,913,789 | 4/1990 | Aung | 204/192.3 |
| 4,973,345 | 11/1990 | France | 204/192.3 X |
| 5,045,165 | 9/1991 | Yamashita | 204/192.15 X |
| 5,073,241 | 12/1991 | Watanabe | 204/192.15 |
| 5,122,249 | 6/1992 | Niemann et al. | 204/192.15 X |
| 5,429,730 | 7/1995 | Nakamura et al. | 204/192.3 X |

TABLE 1 — 257nm

| RUN | POW W/cm² | PRES mTORR | TIME MIN | Ar/H₂ SCCM | C₂H₂-He SCCM | T% 490nm | ∅ DEG | n | T (%) | OD | THICK ANGS. |
|---|---|---|---|---|---|---|---|---|---|---|---|
| 370 | 1.94 | 7 | 30 | 10\5 | 10 | 71 | 165 | 1.75 | 9.9 | 1.0 | 1560 |
| 372 | 1.94 | 7 | 30 | 10 | 20 | 44 | 182 | 1.80 | 4.1 | 1.39 | 1620 |
| 376 | 1.94 | 7 | 30 | 10\1 | 20 | 50 | 179 | 1.76 | 4.4 | 1.36 | 1668 |
| 378 | 1.94 | 7 | 26? | 7 | 21 | 50 | 194 | 1.78 | 4.6 | 1.34 | 1765 |
| 381 | 1.94 | 7 | 26? | 5 | 15 | 44 | 181 | 1.78 | 4.3 | 1.37 | 1650 |
| 382 | 1.94 | 7 | 30 | 5\5 | 15 | 74 | 182 | 1.72 | 9.9 | 1.0 | 1810 |
| 383 | 1.94 | 7 | 30 | 5\3 | 15 | 64 | 197 | 1.77 | 7.1 | 1.15 | 1815 |
| 384 | 1.94 | 7 | 30 | 5\1 | 15 | 47 | 190 | 1.76 | 4.7 | 1.33 | 1768 |
| 387 | 1.94 | 8 | 26 | 7\5 | 21 | 82 | 160 | 1.70 | 13.8 | 0.86 | 1630 |
| 388 | 1.94 | 7 | 26 | 7\1 | 21 | 58 | 181 | 1.75 | 6.4 | 1.19 | 1709 |
| 389 | 1.94 | 7 | 26 | 7\2 | 21 | 66 | 180 | 1.73 | 7.8 | 1.1 | 1640 |
| 390 | 1.94 | 7 | 26 | 7\3 | 21 | 75 | 167 | 1.71 | 11 | 0.96 | 1668 |
| 394 | 1.94 | 7 | 30 | 3 | 20 | 46 | 210 | 1.79 | 3.5 | 1.46 | 1890 |

FIG.8

TABLE 2  248nm

| RUN | POW W/cm² | PRES mTORR | Ar/H₂ SCCM | C₂H₂-He SCCM | ∅ DEG | n | T (%) | OD | THICK ANGS. |
|---|---|---|---|---|---|---|---|---|---|
| 370 | 1.94 | 7 | 10\5 | 10 | 180 | 1.75 | 8.7 | 1.06 | 1653 |
| 372 | 1.94 | 7 | 10 | 20 | 180 | 1.80 | 4.7 | 1.33 | 1550 |
| 376 | 1.94 | 7 | 10\1 | 20 | 180 | 1.76 | 4.7 | 1.33 | 1632 |
| 378 | 1.94 | 7 | 7 | 21 | 180 | 1.78 | 6.2 | 1.21 | 1590 |
| 381 | 1.94 | 7 | 5 | 15 | 180 | 1.78 | 4.9 | 1.32 | 1590 |
| 382 | 1.94 | 7 | 5\5 | 15 | 180 | 1.72 | 11.2 | 0.95 | 1722 |
| 383 | 1.94 | 7 | 5\3 | 15 | 180 | 1.77 | 9.5 | 1.02 | 1610 |
| 384 | 1.94 | 8 | 5\1 | 15 | 180 | 1.76 | 5.9 | 1.23 | 1632 |
| 387 | 1.94 | 7 | 7\5 | 21 | 180 | 1.70 | 11.7 | 0.93 | 1771 |
| 388 | 1.94 | 7 | 7\1 | 21 | 180 | 1.75 | 7.1 | 1.15 | 1653 |
| 389 | 1.94 | 7 | 7\2 | 21 | 180 | 1.73 | 7.2 | 1.14 | 1699 |
| 390 | 1.94 | 7 | 7\3 | 21 | 180 | 1.71 | 10 | 1.0 | 1746 |
| 394 | 1.94 | 7 | 3 | 20 | 180 | 1.79 | 6.2 | 1.21 | 1570 |

FIG.9

SPUTTER DEPOSITION OF HYDROGENATED AMORPHOUS CARBON FILM AND APPLICATIONS THEREOF

This is a continuation of application Ser. No. 08/378,848, filed Jan. 26, 1995, abandoned.

RELATED PATENTS

U.S. Pat. No. 5,470,661, issued Nov. 28, 1995 and entitled Diamond-Like Carbon Films from a Hydrocarbon Helium Plasma.

FIELD OF THE INVENTION

The present invention is direction to methods of sputter deposition of amorphous hydrogenated carbon films.

BACKGROUND OF THE INVENTION

Phase shift asks will be playing an important role in the fabrication of the next generation of microprocessors and high density 256 Mb to 1 Gb DRAM memory chips. Phase masks will improve the lithographic ground rules and hence the performance of circuits at some critical levels by increasing exposure depth-of-focus of the optical tools. This will allow printing of higher aspect ratio profiles in photoresist without sacrificing feature sharpness. Phase masks also may be used for producing small (0.25 μm) transistor gates enhancing circuit speed. Furthermore, by improving mask performance by phase shifting, the life of optical tools in a manufacturing environment will be prolonged at considerable cost saving.

Out of the several phase mask schemes proposed, the single layer attenuated shifter proposed by Burn J. Lin, Solid State Technology, January issue, page 43 (1992), is gaining wider acceptance because of its inherent ease of fabrication. In this case, only a single layer if required with a transmission between 5 and 10% for 180° phase shift at the features mask edges.

At I-Line, 365 nm, a single layer Cr embedded shifter has been proposed by F. D. Kalk et al., Photomask Japan 1994, Japan Chapter of SPIE, Kanagawa Science Park, Kanagawa, Japan 1994.

Also, at 365 nm a $MoSi_xO_yN_z$ (moly-silicon oxy nitride) single layer films have been proposed with acceptable performances by Y. Saito et al., Photomask Japan '94, Japan Chapter of SPIE, Kanagawa Science Par, Kanagawa, Japan 1994.

At DUV, (deep ultra violet), 248 nm, however these nitride and oxy-nitride materials have low transmissivity. Thus, a $Si_3N_4$ (Si) film has been proposed as single-layer attenuated phase shifter material by S. Ito et al., SPIE's 1994 Symp. on Microlithography San Jose, Calif., because it can achieve higher transmissivity at 248 nm. The main problem associated with the moly-silicon-oxynitrides and silicon nitride-silicon materials is that he reactive gas used to etch the film also etches the quartz substrate producing unwanted phase changes. If an additional film is deposited on the quartz to act as a RIE etch stop, then process complications and cost are added to the mask fabrication.

The chlorine based gas used to etch Cr oxides as in the embedded shifter are known to be unreliable and difficult to control. Also, environmental and safety issues associated with the chlorine gas and the hexavalent Cr compounds are in question.

An alternative a-C:H film has already been proposed by A. Callegari et al., J. Vac. Sci. Technol. 11, 2697 (1994) and U.S. copending patent application Ser. No. 08/001,374 filed on Jan. 7, 1993 which application issued into U.S. Pat. No. 5,470,661 on Nov. 28, 1995. Such a film is safely etched in an oxygen plasma and or by using excimer laser ablation and can meet the phase and transmission requirements at UV and DUV. This is achieved by controlling the ratio of diamond to graphitic content in the film by changing the process parameters.

The a-C:H films described in the previous invention were deposited by plasma enhanced chemical vapor deposition (PECVD). It has been reported by G. S. Selwin et al., Appl. Phys. Lett., 57, 1990, that such plasmas tend to generate a high number of particles which are attracted by Coulomb forces to the substrates. This results in unwanted defects on the masks. Dark Cr masks that are manufactured today have a very low particle count, i.e., less than 30 particles per 6 inches square plate. Today, all the mask blanks manufactured for he semiconductor industry use sputtering as the preferred deposition method to minimize the level of particle contamination.

The method of reactive sputtering from a graphite target has been reported in LEYBOLD's Electronics Newsletter No. 4, 12/93, page 14. In this publication reactive sputtering occurs in a Ar/acetylene/hydrogen plasma mixture. In this case a bias is applied to the substrate to obtain higher film density and harness.

Another method, by K. J. Schulz and F. O. Sequeda is described in the IBM technical Disclosure Bulletin, vol. 37 No 06A, June 1994, page 423. This process utilizes low frequency (30–150 KHz) AC power with magnetron sputtering targets and deposition occurs both from sputtering from a graphite target and PECVD of hydrocarbon feed gases such methane.

All the processes described above are optimized for coating magnetic memory devices such as a recording magnetic disk. a-C:H film depositions are optimized to achieve a low friction coefficient between the recording magnetic head and the carbon coated magnetic disk.

It is an object of the present invention to provide a method of sputtering a-C:H film which has the required optical properties to form UV (ultraviolet, e.g., I-Line 365 nm) and DUV (deep ultraviolet, e.g. 248 and 193 nm) attenuated phase shift masks. This method therefore can be easily extended to the current manufacturing tools used in the mask blank industry without incurring extra costs or tool/process development.

It is another object to carry out the depositions by sputtering from a graphite target in a Ar/hydrocarbon/helium/hydrogen/oxygen mixture, preferably with the hydrocarbon being acetylene diluted in He. The reactive hydrocarbon gas helps to make the film with properties similar to PECVD films, such as to achieve higher index of refraction. The hydrogen and oxygen help to increase film transmission. The Ar based sputtering process alleviates the particulate contamination issue associated with a purely PECVD process.

It is another object of the present invention to provide a method of reactive sputtering where the film optical properties at UV and DUV are optimized to meet the requirements of an attenuated phase mask and a conventional mask for use in the fabrication of semiconductor devices. The process gas chemistry and the process parameters in general are uniquely optimized to achieve the required optical properties.

SUMMARY OF THE INVENTION

A broad aspect of the present invention is a method of sputter deposition of an amorphous hydrogenated carbon film.

A more specific aspect of the method according to the present invention is depositing a hydrogenated amorphous carbon film onto a substrate by reactive sputtering from a graphite target in an Ar/hydrocarbon/hydrogen/oxygen plasma.

More specifically, the a-C:H film are deposited onto a substrate by employing Ar, a small amount of hydrogen, acetylene which is heavily diluted with He as the carrier gas and an optional small amount of oxygen. The films produced herein are optically transparent but partially absorbing at 365, 248 and 193 nm making them extremely useful for single layer attenuated phase shift mask applications. Additionally, the films formed by the present invention are readily etched by oxygen reactive ion etching or laser ablation processes therefore facilitating patterning for mask applications.

Another more specific aspect of a method according to the present invention is depositing an amorphous carbon film onto a substrate by reactive sputtering which comprises the steps of: admixing of Ar, hydrogen, optionally a small amount of oxygen and hydrocarbon and helium gases; providing a reactive sputter chamber containing a graphite target and the substrate; and introducing the above process gas mixture into the chamber; and applying a dc bias potential to the graphite target to initiate a plasma and deposit the a-C:H film on the substrate by reactive sputtering of the target.

More specifically the present invention provides a method of deposition an amorphous carbon film by using a gas mixture which comprises Ar, hydrogen, oxygen and acetylene heavily diluted with He to reactively sputter the film from a graphite target. By employing this method, the amorphous carbon film produced is optically transparent but partially absorbing a UV and DUV. More specifically, the UV and DUV transmission associated with the film thickness required for an 180 degrees phase shift at the mask feature edges can be modulated to be between 5 and 10% at 365, 248 and 193 nm. Also a transmission of less than 1% can be obtained at DUV making these films usable as conventional photolithographic masks at these wavelengths. Possible mask fabrication flowcharts are also included.

BRIEF DESCRIPTION OF THE DRAWINGS

Further objects, features, and advantages of the present invention will become apparent from a consideration of the following detailed description of the invention when read in conjunction with the accompanying drawings, in which:

FIG. 8 shows a table of process parameters and optical properties at 257 nm.

FIG. 9 shows a table of process parameters and optical properties at 248 nm.

DETAILED DESCRIPTION

The present invention relates to a method of producing a high quality hard hydrogenated amorphous carbon film to be used as a single layer attenuated phase shift mask absorber, by reactive sputtering from a graphite target. The optical properties at UV and DUV and the lithographic features of the film produced by the present invention are vastly superior to those obtained by other films such as moly-silicon-oxynitride, silicon nitride-Si and Cr embedded shifter described earlier. Thus, quart substrates coated with the amorphous carbon film of the present invention are extremely useful as mask blanks for fabrication into attenuated phase shift masks to be used at UV and DUV wavelengths.

Figure 1:
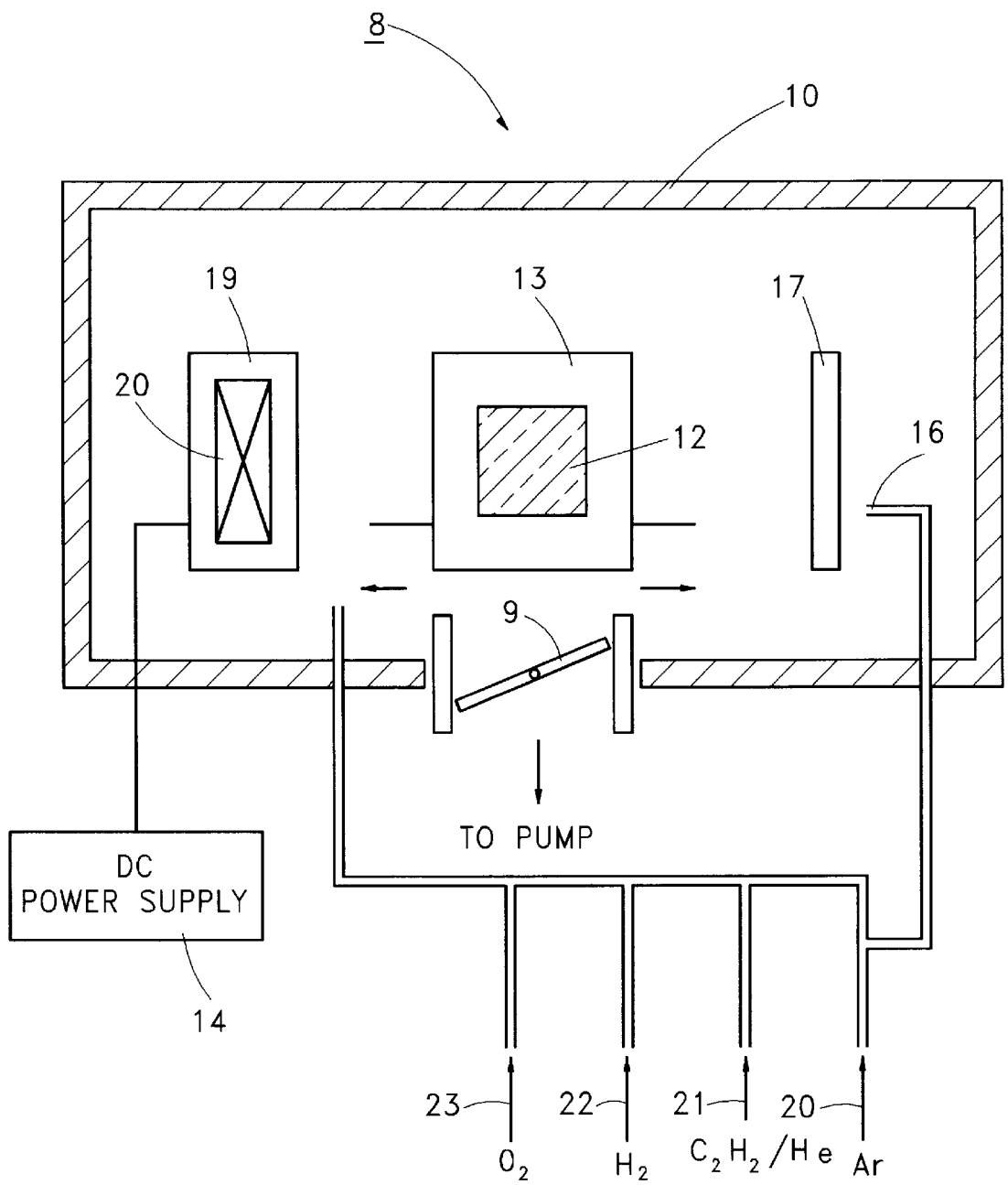
FIG. 1 is a schematic diagram of a sputter deposition apparatus useful to practice the present invention.

FIG. 1 is a diagram of a sputter deposition apparatus 8 that can be used to deposit the amorphous carbon film of the present invention. The apparatus includes a sputtering chamber 10, having a throttle valve 9 which separates the reactor chamber 10 from a vacuum pump not shown. A graphite sputtering target 19 is mounted in the reactor chamber 10. Permanent magnets 20 are located on the backside of the target to enhance plasma density during the sputtering. The sputtering target is electrically connected to a DC power supply 14. An ion gun 17 is mounted on the reactor chamber 10. The inlet 16 allows Ar gas to flow into the ion gun. A quartz substrate 12 is mounted on the sample holder 13 which can translate it back and forth in front on the sputtering target or the ion gun by virtue of being mounted on the mechanical drive 13. During ion beam cleaning the substrate translates back and forth in front of the ion gun 17 so as to achieve a uniform cleaning. During reactive sputtering the substrate 12 translates back and forth in front of the sputter target 19 so as to achieve uniform film deposition.

The reactor chamber 10 also contains conduits 20, 21, 22 and 23 for introducing various gases into the rector chamber 10. For example, the pre-mixed hydrocarbon helium gas mixture, hydrogen and the oxygen gas are introduced i the reactor chamber 10 through conduits 21, 22 and 23, respectively, while Ar gas for ion beam cleaning and sputtering is introduced through conduit 20.

The hydrocarbon gas used in the present invention may be any hydrocarbon compound which is first capable of being gaseous and then able to form a plasma at the reaction condition employed in the present process. The term hydrocarbon implies that the molecules which make up the compound contain only carbon and hydrogen atoms. In accordance with one embodiment of the present invention, saturated or unsaturated hydrocarbon compounds may be employed by the present process. By definition, a saturated hydrocarbon compound is a compound whose molecules contain only carbon single bonds while an unsaturated compound is a compound whose molecules contain carbon double or triple bonds. Suitable hydrocarbons contemplated by the present process includes alkanes, alkenes, and alkynes.

An alkane is defined herein as a compound whose molecules contain only single bonds between carbon atoms. Suitable alkanes which may be employed by the present process include compounds such as methane, ethane, propane, butane, and the like thereof. Of these alkanes, methane is most particularly preferred.

Alkenes are defined herein as compounds whose molecules contain a carbon-carbon double bond. Alkene compounds which may be employed by the present process include compounds such as ethene, propene, isobutene, n-butene and the like thereof.

An alkyne compound is defined herein as a hydrocarbon whose molecules contain a carbon-carbon triple bond. Suitable alkynes employed by the present process include acetylene, propyne, 1-butyne, 2-butyne and the like thereof. Of these alkynes, acetylene is most particularly preferred.

It is especially preferred embodiment of the present invention that the preferred reactive hydrocarbon gas which is employed in forming the amorphous carbon film is acetylene. Additionally, it should be recognized that mixtures of hydrocarbon gases such as acetylene/methane may also be contemplated as the reactive hydrocarbon gas of the present invention. More preferably, the hydrocarbon is diluted with helium such as the final concentration of hydrocarbon in the admixture is from 1 to 10%. Most preferably the hydrocarbon constitutes about 2% of the overall gas mixture.

Gases employed by the present invention preferably have a purity greater than about 95.5%. In a preferred embodiment, the gases have a purity in the range from about 98.5 to about 99.99%. Most preferably, the gases have a purity of about 99.99%.

The high purity diluted hydrocarbon gases are pre-mixed in the same gas cylinder before being introduced in the reaction chamber. The argon, hydrogen, oxygen and hydrocarbon/helium gases are introduced into the chamber by first passing them through separate flow controllers at a sufficient flow to provide a total pressure of the process gas mixture from about 1 mTorr to 50 mTorr. To provide the most effective amorphous carbon film it is preferred that the pressure of the process gas mixture be about 1–20 mTorr. The above conditions can also be obtained by introducing the hydrocarbon-helium gases separately through flow controllers or by premixing the Ar, hydrogen, oxygen, hydrocarbon/helium in several gas cylinders in any possible safe combination providing the desired sputtering pressure. More preferably the argon, oxygen, hydrogen and hydrocarbon/helium mixture are introduced into the chamber though separate flow controllers.

Suitable substrates which may be coated with the amorphous carbon film of the present invention include materials such as plastic; metals; various types of glass; magnetic heads; electronics ships; electronic circuit boards; semiconductor devices and the likes thereof. The substrate to be coated may be any shape or size provided that the substrate may be placed into the sputtering chamber apparatus. Thus, regular or irregular shape objects having any dimension may be used in the present invention. More preferably the substrate is a quartz or glass plate used in he production of photolithograhic masks used for fabricating semiconductor devices.

The substrate is mounted on the substrate holder inside the reactive sputtering chamber of the sputter device. The reactive sputtering chamber is then tightly sealed and evacuated until a pressure reading in the range of about $1\times10^{-4}$ to about $1\times10^{-7}$ Torr is obtained.

After evacuating the reaction chamber to the desired pressure range mentioned hereinabove, the substrate can be optionally heated to a temperature from 25° to 400° C. Most preferably, the substrate is held at a constant temperature of 25° C. throughout the entire deposition process.

The substrate material used may be optionally subjected to in-situ ion beam cleaning using the ion gun mounted on the chamber, prior to depositing the amorphous carbon film.

Suitable cleaning technique employed by the present invention include plasma sputtering or ion beam cleaning with hydrogen, argon, oxygen, nitrogen or mixtures thereof, performed single or in a suitable sequential combination.

After achieving the desired pumpdown pressure, the admixed gases are introduced into the reactive sputter chamber at a total flow rate of about 1 to 100 sccm. More preferably the flow rate proportion of the reactive gas mixture (namely the acetylene diluted in He) is from 5 to 100 sccm, the flow rate of the sputtering gas (namely Ar) is from 1 to 100 sccm, and the flow rate of the hydrogen and the optional oxygen gas is from 1 to 10 sccm. Most preferably, the flow rate of the admixture of hydrocarbon and helium is about 21 sccm, the flow rate of the Ar sputtering gas is about 7 sccm, and the flow rate of hydrogen and the optional oxygen gases each is about 1 sccm. The mixture is introduced into the reaction chamber at a pressure of about 1 to 20 mTorr. It is another preferred aspect of the instant invention that the admixture be introduced at a pressure of about 7 mTorr. In order to obtain a reactive sputtering plasma of the gas mixture, the graphite target was held at a fixed dc bias voltage from about 300 to 800 Volt throughout the deposition process. Most preferably, the cathode bias was maintained at about 500 Volt throughout the process. This voltage is supplied to the target by using a dc power supply source. The power density applied to the sputter target is from 0.8 to 19.4 W/cm$^2$. Most preferably, the power density employed by the present invention is maintained at about 2 W/cm$^2$ throughout the deposition process. The amorphous carbon film is deposited onto the substrate at a rate such as that an essentially continuous coating of the film on the substrate is obtained. More specifically, by employing the previously mentioned operation parameters, the amorphous carbon film is deposited onto the substrate at a rate of about 20 to 400 A/min. Most preferably, the rate of depositing the amorphous carbon film onto the substrate is at a rate of 66 A/min.

In accordance with the present invention, the amorphous carbon film deposited on the substrate are from 500 to 5000 A thick. More preferably, the thickness of the amorphous carbon film coating is from 1000 to 2500 A. It should be noted that by changing the resultant film thickness and/or the hydrogen content the transmission of the film can be changed. Thus, it is quite possible to make a substrate with a defined transmission by merely increasing or decreasing the thickness and/or the hydrogen content of the film by using a process gas containing hydrogen. The preferred transmissivities of the amorphous carbon film prepared by the present process are in the range from about 5 to 10% at a wavelength of 365, 248 and 193 nm which correspond to a film thickness of about 1000 to 2500 A.

After depositing the amorphous carbon film onto the substrate, the coated material depending on the specific application may or may not be annealed. Annealing typically involves heating the substrate in an atmosphere of Ar/hydrogen from 100° to 400° C. Most preferably, the amorphous carbon film is not annealed.

The amorphous carbon films of the present invention also provide a substrate with an extremely hard protective coating. The films are optically transparent at wavelengths of about 550 to about 750 nm, and are partially absorbing from 190 to 500 nm.

Mainly, the amorphous carbon film formed by the present invention can be used as an ideal absorber for UV (365 nm) and DUV (248 ad 193 nm) single layer attenuated phase shift masks. Such photomaskss will be used as a replacement for chrome mask blanks in the fabrication of some critical levels of future semiconductor chips. These masks will enhance the optical performance of the optical lithographic tools.

The carbon photomasks can be laser ablated using high fluences of 193 nm laser radiation or reactive ion etching in oxygen. The etch rate ratio between carbon and photoresist in an oxygen reactive ion etch (RIE) process is about 1:2. This means that carbon photomask can be etched and patterned using conventional techniques. Repairing defective masks for missing film defects is possible because carbon can be deposited by focused ion beam methods. Repairing opaque defects, i.e. removal of carbon from an unwanted area is possible by laser ablation. Thus, other supporting processing means exist today to produce defect free masks, as and when the carbon film of the right optical properties is produced by the method taught by the present invention.

In the phase shift mask technology, in order to reduce interference effects at the mask feature edges and thus increase resolution of photoresist profiles, the following carbon film thickness is required:

$$d = (\lambda/2)/(n-1) \tag{1}$$

where d is the film thickness measured by profilometry, $\lambda$ is the wavelength of the radiation used in the imaging process, and n is the index of refraction of the film at that wavelength. In general n values ranged between 1.6 and 2.2. More commonly the n values were between 1.71 and 1.78 at DUV. When hydrogen is added to the process the index of refraction decreases and film transmission increases. For the processes used here transmissivities between 4 and 10% at UV and DUV can be easily obtained.

The carbon films of the present invention have low reflectivity of 9–11% at 248 nm which will serve to reduce the unwanted flare reflected from the reticle/mask.

The following examples are given to illustrate the scope of the present invention. Because these examples are given for illustrative purposes only the invention embodied therein should not be limited thereto.

EXAMPLE 1

The following example is given to illustrate the process of depositing an amorphous carbon film onto a substrate, preferably quartz, by reactive sputtering from a graphite target in a argon/hydrogen/acetylene/helium mixture.

The experiments were carried out for depositing the amorphous carbon film on one inch round quartz discs, on 5 inches×5 inches×0.090" thick and 6 inches×6 inches× 0.250 inch thick quartz plates. The substrates, which were already precleaned, were blow dried with (filtered) nitrogen gas to remove residual particulates before being loaded on the substrate holder of FIG. 1. Thereafter, the system was evacuated to a base pressure reading of about $1 \times 10^{-6}$ Torr or lower. The substrates were first ion beam cleaned for 3min at 500 V, ma/cm$^2$ of beam current density at 1 mTorr of pressure to ensure good adhesion of the carbon film to the quartz substrates. The amorphous carbon films were deposited from a mixture of argon/hydrogen/acetylene-helium gases, in a flow rate ratio of 7/1/21 sccm respectively, (Process 388, Table 1), at a power density of 1.94 W/cm2, and a pressure of 7 mTorr. The gases employed in the present process have a purity of greater than about 99.99% and furthermore the hydrocarbon/helium gas mixture comprises 98% acetylene and 2% helium. The amorphous carbon film was deposited onto the substrates at a rate of about 66 A/min.

The process was stopped after a film thickness of about 1600–1700 A was obtained.

EXAMPLE 2

The following example illustrates the optical properties of the amorphous carbon film formed by reactive sputtering from a graphite target in an argon/hydrogen/acetylene-helium mixture. The optical properties of the substrates coated in the manner described in Example 1, that are measured in this example are: 1) the optical density OD, 2) the percentage transmission T%, 3) the phase angle f, and 4) the index of refraction n. The optical density OD is defined as the logarithm to the base 10 of the transmission T through the film, where T is defined as the ratio of the intensity of transmitted light to the intensity of the incident light. Thus:

$$OD = \log_{10} T \tag{2}$$

and $$T = 10^{-OD} \tag{3}$$

Figure 2:
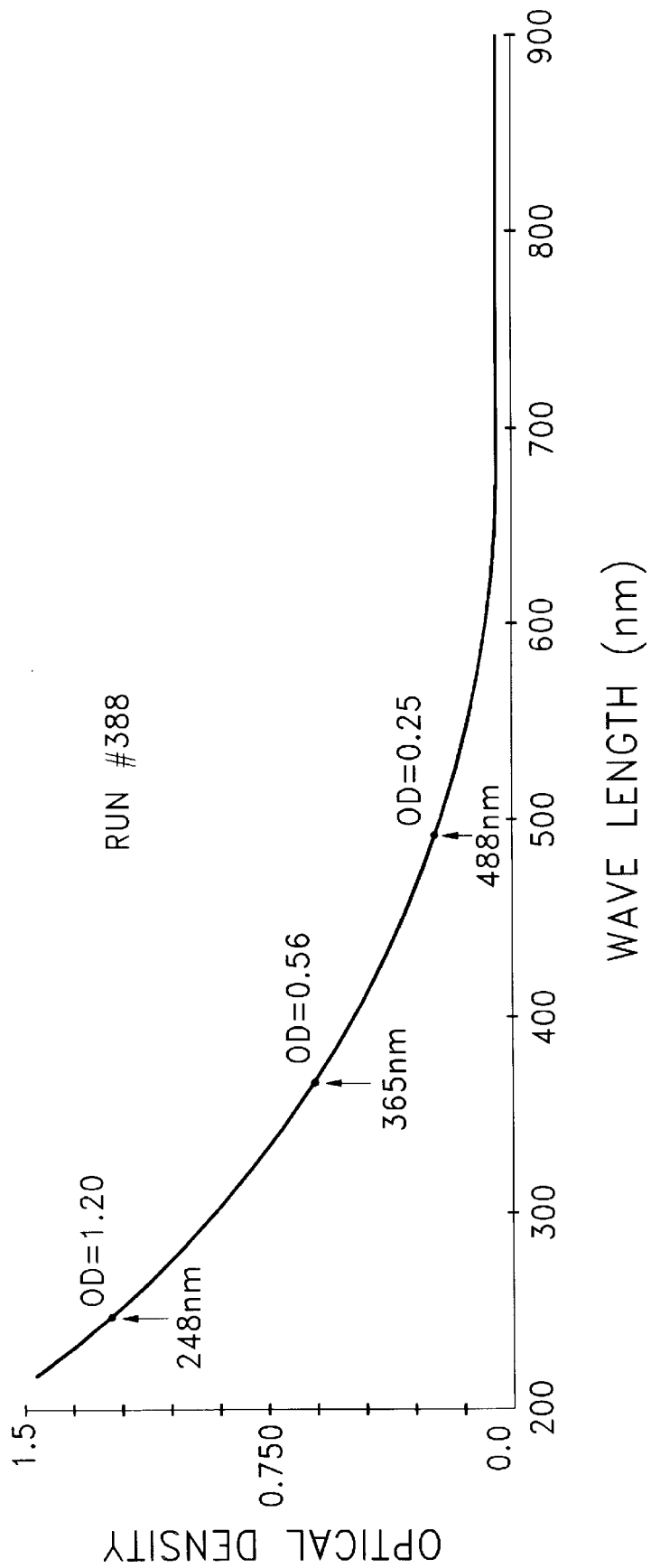
FIG. 2 shows a plot of optical density versus wavelength for an amorphous carbon film formed according to the present invention.

Furthermore, the optical density is directly proportional to the film thickness through the equation:

$$OD = \alpha d \tag{4}$$

where $\alpha$ is the linear absorption coefficient which is a property of the material dependent on the wavelength at which it is measured. Optical densities in this example are measured using an IBM Instruments Model #9420 UV—Visible spectrophotometer in the wavelength range from 900 to 200 nm. A typical spectrum is shown in FIG. 2.

Figure 3:
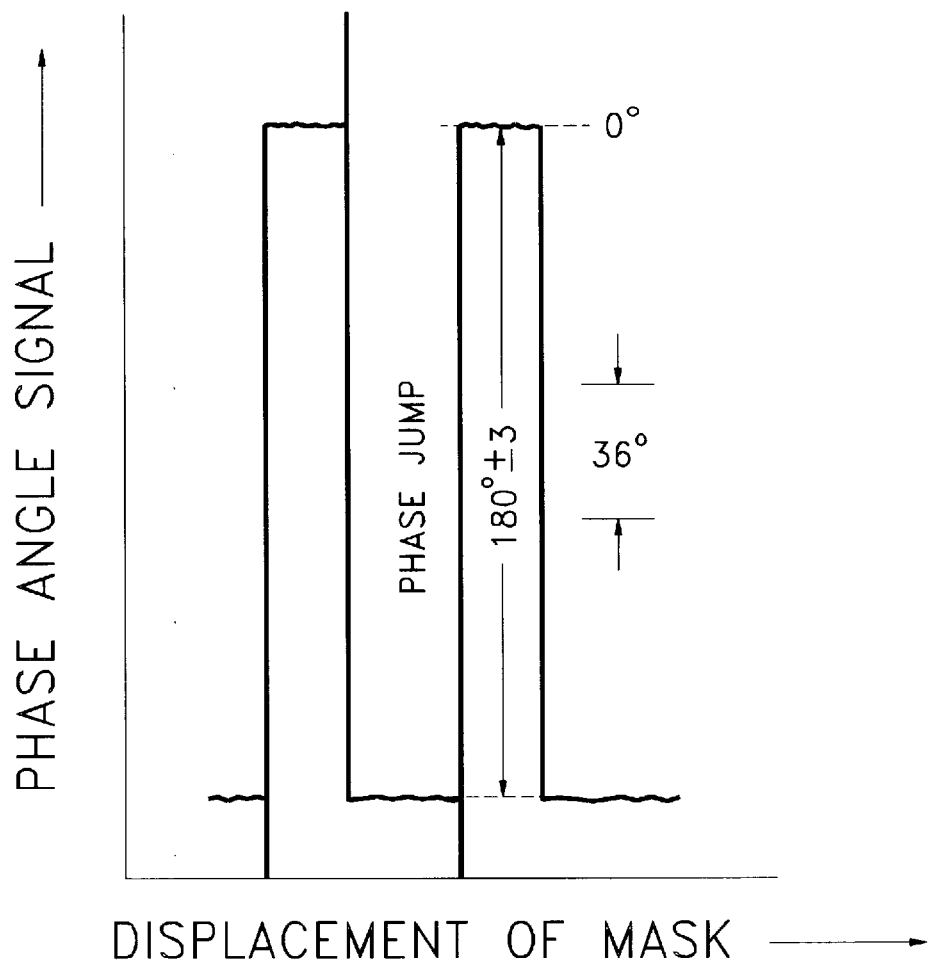
FIG. 3 shows a plot of the phase angle signal as a function of mask displacement.

Phase angles of the amorphous carbon film were measured directly by a two beam laser interferometer operating at 257 nm. A description of this setup is found in the work by D. Dove et al., Proc. 12th Annual BACUS, SPIE, Sunnyvale Calif., September 1992. In this technique about 1 mW of radiation at 257 nm is obtained by passing several watts of a green light beam at 514 nm from an Ar ion laser through a frequency doubler. The spots at the substrate are about 30 µm in diameter and are separated by 300 µm. Direct phase measurements were obtained by comparing the difference in the optical path of the beams going through the quartz and the a-C:H coated regions on the quartz. This was achieved by slowly moving the two beams across a sharp a-C:H/quartz step. These sharp steps were formed by oxygen reactive ion etching the amorous carbon film through a phototresist stencil defined by standard photolithogrpahy. Data from phase measurement using this setup are shown in FIG. 3.

Phase angle measurements on a-C:H films deposited on quartz substrates were used to calculate the refractive index, n, of the film by rewriting Eq. (1) as:

$$n = 1 + \lambda(\Phi)/d \tag{5}$$

where $\lambda(\Phi)$ is the measured phase angle $\Phi$ in degrees converted into a fraction of wavelength according to the equation, $$\lambda(\Phi) = \lambda X(\Phi/360) \tag{6}$$

general n value ranged between 1.75 and 1.85 for the various process used here. The n values were calculated at 257 nm. We assumed that n does not vary appreciably from this value at 248 nm. Furthermore, when targeting 180° phase at 248 nm a correction of about 6.5° should be added to the phase measured at 257 nm to account for the difference in wavelength. Thus, the ample shown in FIG. 3 would have a phase of about 186°±3°.

Table 1 of FIG. 8 contains a summary of process parameters and optical properties described above. Note that the transmission at 488 nm is added to the table. In the current industry practice, masks are inspected for defects at this wavelength by measuring the transmitted light through the mask. The highest transmission at 488 nm that these inspection tools can tolerate is about 80%. It is clear that the a-C:H films produced by the method of the present invention meet this requirement.

Table 1 represents the optical properties in the raw data form. It shows that phase angles of 180°±5° are obtained on several runs. These phase angles are measured at 257 nm. Thus, the corresponding right phase angles at 248 nm are obtained by adding a 6.520 correction to the raw phase angles data of table 1. Since phase angles and thicknesses are directly proportional, we can calculate the film thickness necessary to produce 180° phase shift at 248 nm for the runs shown in Table 1. Also according to Eq. (4) the optical density OD and film thickness d are directly proportional through the absorption coefficient α. Thus, for each film thickness corresponding to a phase angle of 180° the corresponding optical density can be calculated. For example, from run 386 of Table 1 we have an 169° phase change at 257 nm for a total film thickness of 1665 A. The corresponding phase change at 248 nm would be about 176°. Thus, a film thickness of (180/176)×1665=1703 A will produce the desired 180° phase change at 248 nm. The corresponding optical density would be OD=(1703/1665)× 0.99=1.01. The transmission using Eq. (3) is $T=10^{-OD}=$ 0.098 or 9.8%.

Table 2 shows film thicknesses needed for 180° phase shift at 248 nm using Eq. (1) and the corresponding optical properties extrapolated from the data of Table 1. Thus, by choosing the proper film thickness, transmissivities between 4.7 and 11.2% can be obtained by changing the process parameters such as process gas mixture. Proper film thicknesses deposited on quartz substrates are achieved by careful timing of the duration of the reactive sputter deposition process as described in Example 1.

EXAMPLE 3

This example illustrates how the film properties of the amorphous carbon film can be modified to extend its use as an attenuated phase shift mask at I-line, 365 nm, and DUV, 193 nm, and a conventional mask. The processes described in Table 1 are optimized for attenuated phase shift mask operating at 248 nm.

Figure 4:
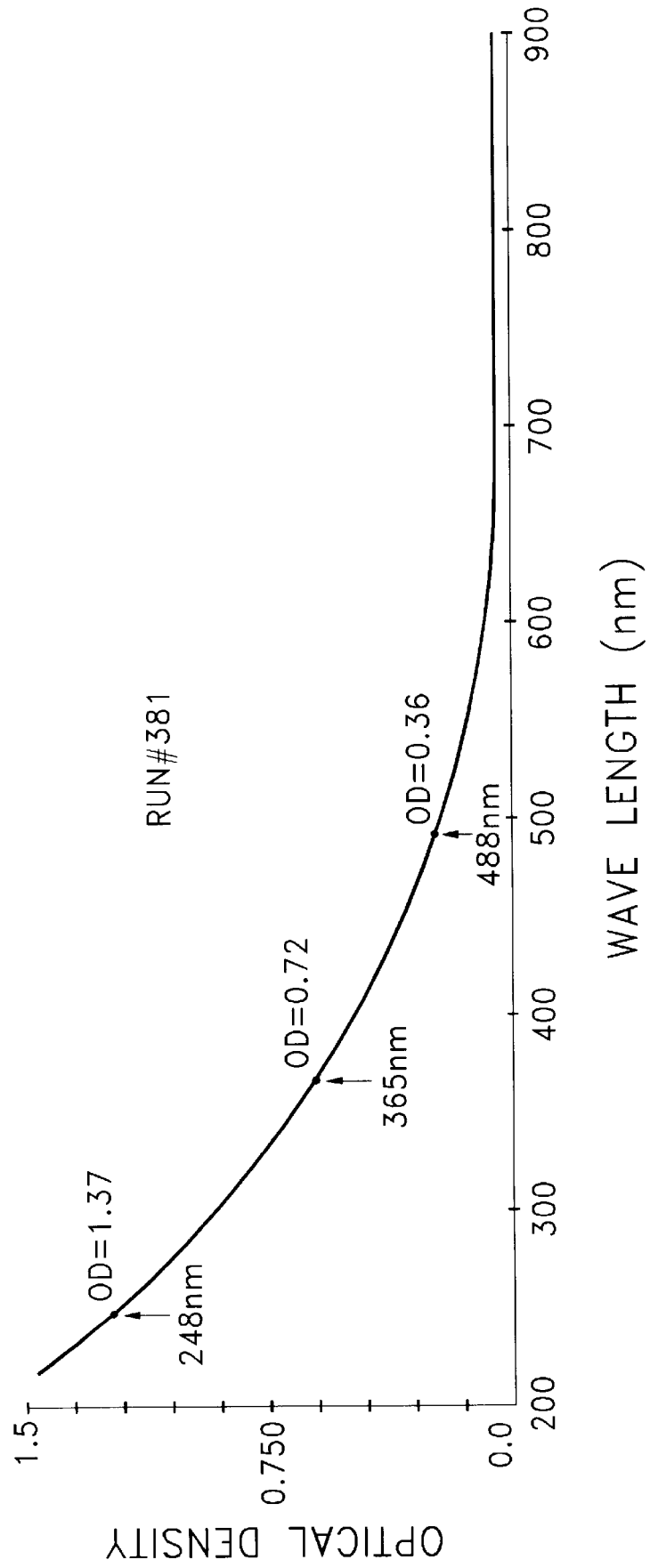
FIG. 4 and FIG. 5 shows a plot of optical density versus wavelength for another amorphous carbon film according to the present invention.

First, a process is described that achieves films with a transmission between 5 and 10% at 365 nm. FIG. 4 shows the optical density vs wavelength of Run 381. At 365 nm an OD of 0.72 is obtained. The index of refraction of an amorphous carbon film at 365 nm was reported by Callegari and al., J. Vac. Sci. Technol., 11, 2697 (1994) to be higher than the value at 257 nm by an amount of about 14%. Thus, the index of refraction calculated from the 257 nm value shown in Table 1 for Run 381 would be, n=1.78×1.14=2.03. Using Eq. (1), the required film thickness necessary to produce 180° phase shift at 365 nm is d=(365/2)(2.03−1)= 177.2 nm or 1772 A. The corresponding optical density would be OD=(1772/1650)×0.72=0.77. By using Eq. (4) a corresponding transmission value of 17% is obtained. This number is higher than the required 10%. In order to reduce film transmissivity to at least 10% the film can be deposited at elevated temperatures or can be deposited at room temperature and then annealed or deposited at elevated temperature and then annealed. In all these cases hydrogen loss occurs, the amount of the tetrahedral bonds decreases and the amount of trigonal graphitic bonds increases. This produces optically darker films which can satisfy the condition of a transmissivity of 10% or lower. Substrate deposition temperatures are preferably between 100° and 300° C. and annealing temperature are preferably between 100° and 400° C.

The process shown in Table 1, Run 390, can be used to deposit an amorphous carbon film to be used as an attenuated phase shifter at 193 nm, since higher transmissivities are achieved when hydrogen is added to the process gas mixture.

At 193 nm the index of refraction may be lower than the ones reported in Table 1. Here, we assume n=1.70. The extrapolated value of the optical density at 193 nm from FIG. 5 (top curve) is 1.41. Film thickness is 1668 A. Using Eq. (1), the film thickness necessary to produce 180° phase shift at 193 nm is d=(193/2)/(1.70−1)=137.9 nm or 1379 A. The corresponding optical density would be OD=(1379/ 1668)×1.41=1.17. By using Eq. (4) a transmission of 6.8% is obtained. This number is within the required 5–10% target. If hydrogen is not used in the gas mixture lower transmissivities are obtained.

Figure 5:
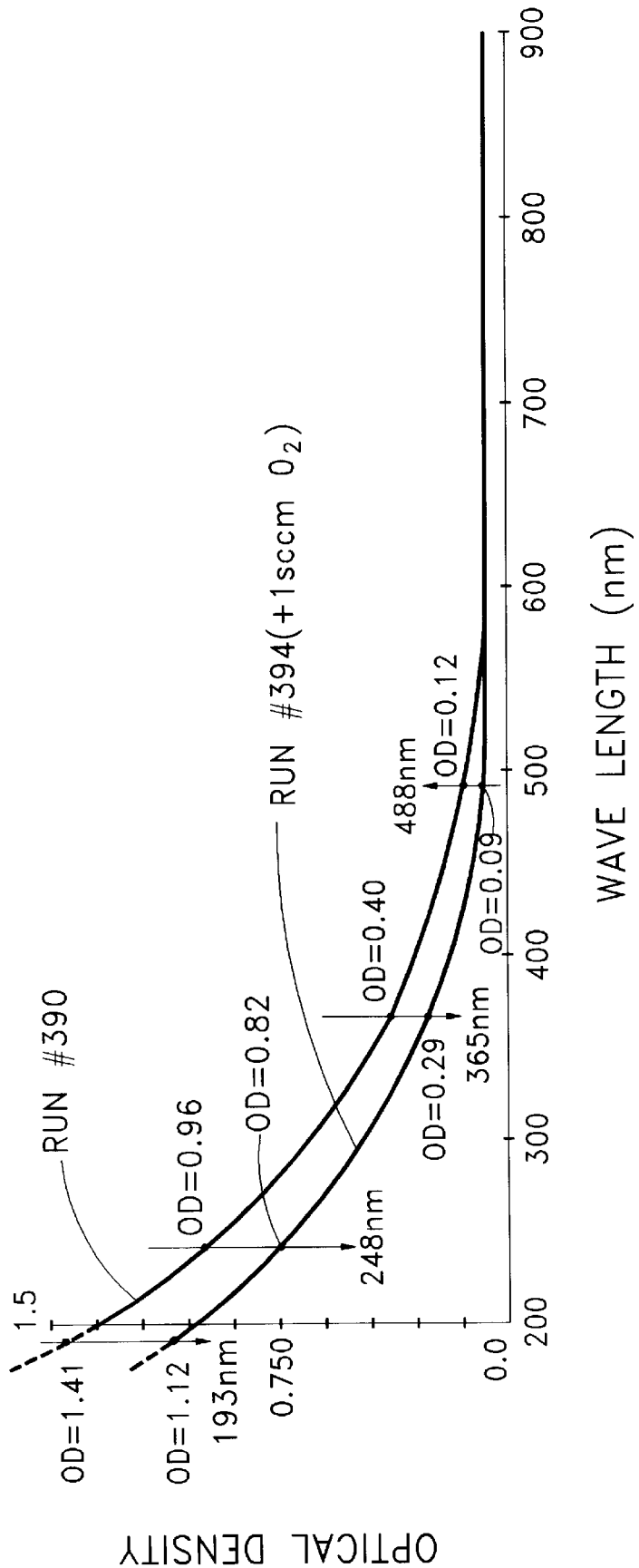

If even higher transmissivities are required, small amounts of oxygen can be added to gas mixtures. The optical density vs wavelength for a film deposited using the parameters shown in Table 1, run 394, but with the addition of 1 sccm of oxygen gas is also shown in FIG. 5 (lower curve). This film shows a very high optical transparency. It has been shown b Y. Liou et al., Mat. Res. Symp. Pro. Vol. 162, page 109, 1990 that oxygen enhances diamond formation at low temperatures by etching away graphitic contents during the chemical vapor deposition process (CVD). Thus, the same effect may be occurring in carbon films deposited by reactive sputtering using small amount of oxygen gas. Film thickness is 1740 A and extrapolated optical density is 1.12. Assuming n=1.7 and using the same arguments as above a transmission of 13% is obtained. Thus, by changing the gas mixtures carefully transmissivities from 5 to 13% can be obtained at 193 nm.

In a conventional photolithographic shadow mask, film absorption has to be very high with optical densities grater than 2 or transmissivities less than 1%. Film thicknesses should not be higher than 2500 A because defect density may increase and pattern edge profiles may deteriorate. From Table 1, Run 381 we obtain OD=(2500/1650)×1.37 =2.08 which satisfies the above requirement. Thus, at DUV, the amorphous carbon film can be used as conventional (no phase shift) DUV absorber.

EXAMPLE 4

This example shows how a practical attenuated phase shift mask can be fabricated using the amorphous carbon film described in the previous examples.

Figure 6:
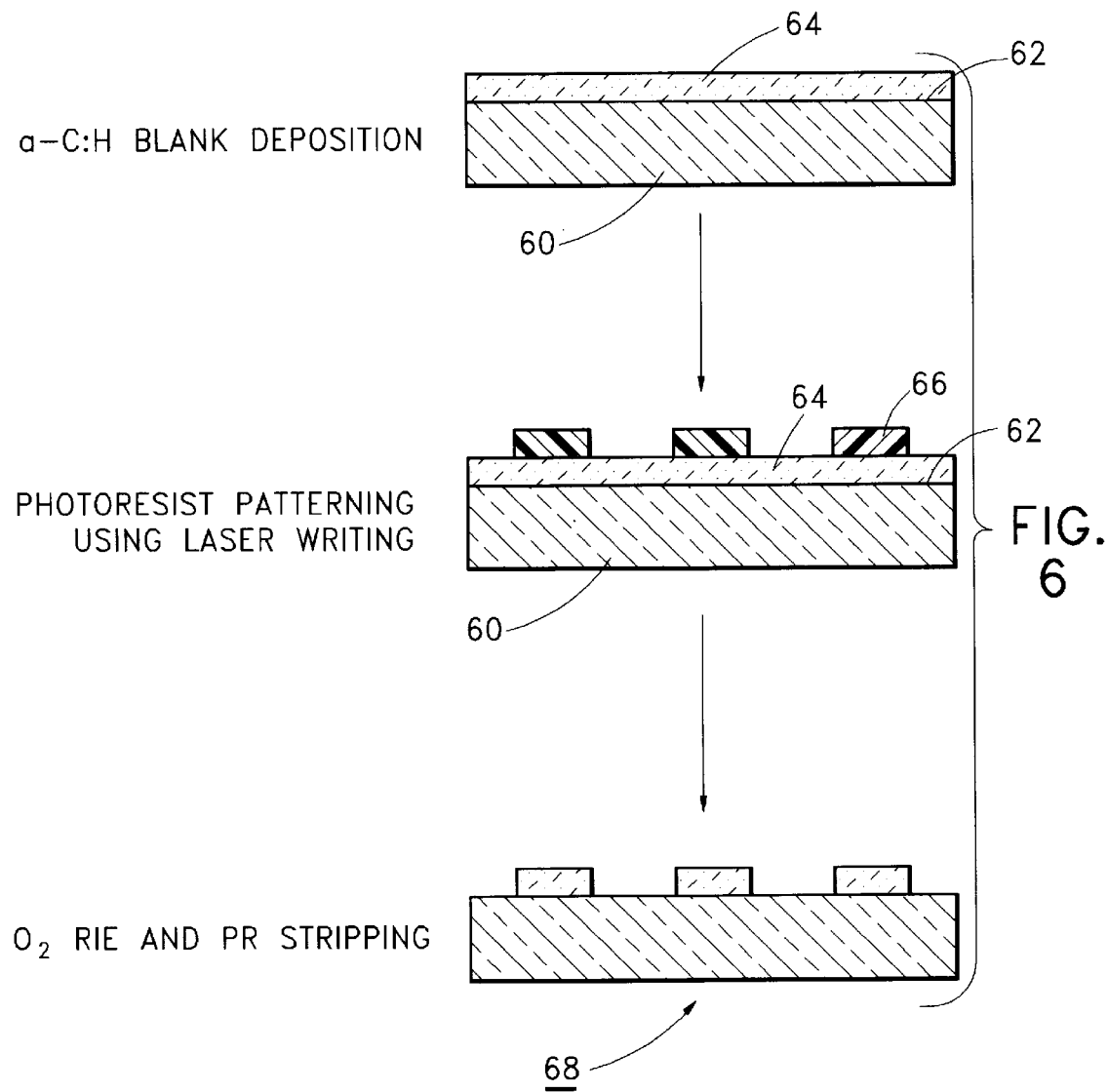
FIG. 6 schematically shows a process using RIE etching for fabricating a phase shift mask according to the present invention.

The amorphous carbon film is deposited on precleaned quartz plates which can be of any size. More preferable plates are 5 inches square and 0.090 inch thick, 6 inch square 0.150 inch thick, 6 inch square and 0.250 inch thick. Most preferably the substrates are 6 inch square and 0.250 inch thick. Film depositions are chosen according to the parameters shown in Table 2.Photoresist is then spun onto the amorphous carbon coated quartz plate. Photoresist is then exposed to a laser writing tool and then developed. Laser writing doses not result in any substrate charging and therefore avoids image deformation which is a common problem with electron beam patterning of resist on electrically insulating films such as the a-C:H films. After resist imaging, the a-C:H film can be etched using reactive ion etching (RIE) in an oxygen plasma. The quartz acts as an etch stop. After resist striping the mask is ready for use. This fabrication process is shown schematically in FIG. 6. On surface 62 of quartz substrate 60 an amorphous carbon film 64 is sputtered according to the present invention. A photoresist 66 is deposited onto film 64 and patterned. An oxygen RIE is used to etch a pattern through the patterned photoresist in the amorphous carbon film 64. The photoresist is removed leaving a phase shift mask 68.

Figure 7:
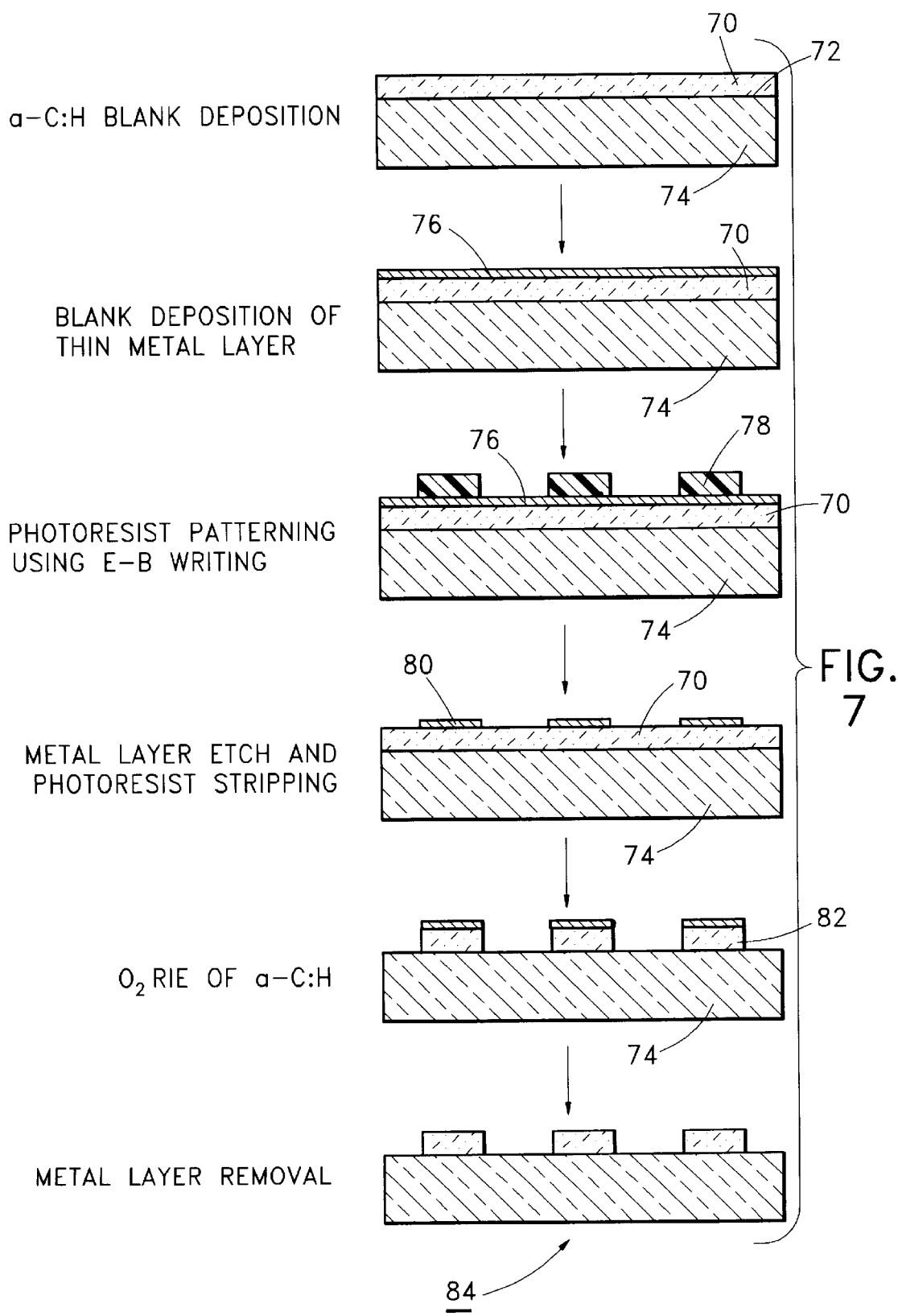
FIG. 7 schematically shows a process using an electron beam for fabricating a phase shift mask according to the present invention.

Alternatively, if an electron beam is used to pattern the film the fabrication process is outlined below and shown schematically in FIG. 7. A blanket amorphous carbon film 70 is deposited onto surface 72 of quartz substrate 74. Since electron beam patterning produces charging of the insulating a-C:H film, a thin metal layer 76 (Al Cr, Ti.) is be deposited on tope of the amorphous carbon film. Then photoresist 78 is spun onto the structure, exposed to an electron beam writer and developed. By using a wet or dry etch the metal film is patterned 80 and then the resist is stripped. The amorphous carbon film is very resistant to chemicals and dry etch gases used for metal etching and thus acts as an etch stop. The amorphous carbon film is then etched to form pattern 82 in an oxygen plasma by RIE with the thin metal layer acting as an etch mask. Finally, the metal layer is removed by wet chemical etch, leaving a patterned amorphous carbon film on the quartz substrate. The mask 84 is then ready to be used.

While the present invention has been described with respect to preferred embodiments, numerous modifications, changes, and improvements will occur to those skilled in the art without departing from the spirit and scope of the invention.

Having thus described our invention, what we claim as new, and desire to secure by Letters Patent is:

1. A method of forming a work piece by depositing an amorphous hydrogenated carbon film onto a substrate by reactive sputter deposition which comprises the steps of:

providing a deposition chamber containing an ion gun, said substrate, a graphite target outside said ion gun, and a pumping means to evacuate said chamber;

introducing a precleaning gas containing an inert gas through the ion gun, producing an energetic flux of said precleaning gas in ionic form and using said precleaning gas to preclean said substrate;

providing a process gas containing argon, hydrogen, and a reactant gas containing a hydrocarbon gas and helium gas;

introducing said process gas into the chamber, applying a dc bias voltage to the graphite target and using argon as a sputtering gas to reactively sputter deposit an amorphous hydrogenated carbon film from said graphite target onto said substrate wherein:

said argon is introduced into said chamber at a flow rate of from about 1 to about 100 sccm;

said hydrogen is introduced into said chamber at a flow rate of from about 1 to about 10 sccm; and an oxygen placed into said chamber is introduced at a flow rate of no more than about 10 sccm;

said hydrocarbon and said helium are introduced into said chamber, as a combined gas, at a flow rate of from about 5 to about 100 sccm, said combined gas containing from about 50% to about 1% hydrocarbon and from about 50% to about 99% helium to provide said amorphous hydrogenated carbon film with an optical transmission of 0.5% to 10% at the wavelengths of 365 nm, 248 nm or 193 nm, less than 80% transmission at 488 nm wavelength, and a refractive index 1.6 to 2.2 at 365 nm, 248 nm or 193 nm.

2. A method according to claim 1 wherein the hydrocarbon is an unsaturated or saturated hydrocarbon.

3. A method according to claim 2 wherein the saturated hydrocarbon is an alkane.

4. A method according to claim 3 wherein the alkane is selected from the group consisting of methane, ethane, propane and butane.

5. A method according to claim 4 wherein the alkane is methane.

6. A method according to claim 2 wherein the unsaturated hydrocarbon is selected from the group consisting of an alkene or an alkyne.

7. A method according to claim 6 wherein the alkene is selected from the group consisting of ethene, propene, isobutene and n-butene.

8. A method according to claim 6 wherein the aklyne is selected from the group consisting of acetylene, propyne, 1-butyne and 2-butyne.

9. A method according to claim 8 wherein the alkyne is acetylene.

10. A method according to claim 1 wherein said argon, said hydrogen, said oxygen, said hydrocarbon and said helium gases are 98.5 to 99.99% pure.

11. A method according to claim 1 wherein said diluted gas comprises 2% acetylene and 98% helium.

12. A method according to claim 1 wherein said process gas is introduced into said chamber at total flow rates of 1 to 100 sccm and at a total pressure of 1 to 20 mTorr.

13. A method according to claim 12 wherein said flow rate is 5 to 100 sccm.

14. A method according to claim 13 wherein said flow rate is about 20 sccm.

15. A method according to claim 12 wherein said flow rate of said argon gas is 1 to 100 sccm.

16. A method according to claim 15 wherein flow rate for said argon is about 7 sccm.

17. A method according to claim 12 wherein said flow rate of said hydrogen gas is no more than about 10 sccm.

18. A method according to claim 17 wherein said flow rate of said hydrogen gas is 1 sccm.

19. A method according to claim 12 wherein the flow rate of said oxygen gas is 1 to 10 sccm.

20. A method according to claim 12 wherein a ratio of low rates of said reactant to argon gas to hydrogen gas is 20:7:1.

21. A method according to claim 20 further including an oxygen gas flow added in the amount to 1% of said total flow rate.

22. A method according to claim 1 wherein the graphite target is biased with a negative dc voltage of from about 300 to about 800 volts.

23. A method according to claim 22 wherein the dc voltage of the target is about 500 volts.

24. A method according to claim 1 wherein a dc power density applied to said graphite target is from about 0.8 to about 20 watts/sq. cm.

25. A method according to claim 24 wherein said dc power density to said graphite target is 2 watts/sq. cm.

26. A method according to claim 1 wherein the said substrate is precleaned with a plasma or an ion beam of argon or argon and oxygen prior to the deposition of said amorphous hydrogenated carbon film.

27. A method according to claim 1 wherein said amorphous hydrogenated carbon film deposited has an amorphous crystal structure containing hydrogen.

28. A method according to claim 1 wherein said amorphous hydrogenated carbon film has a thickness of about 500 to 5,000 A.

29. A method according to claim 1 wherein said amorphous hydrogenated carbon film has a thickness of about 1000 to 2500 A.

30. A method according to claim 1 wherein said substrate is selected from the group consisting of a glass plate or a quartz plate.

31. A method according to claim 1 wherein said amorphous hydrogenated carbon film is deposited at a rate of about 20 A/min to 400 A/min.

32. A method according to claim 1 wherein said amorphous hydrogenated carbon film is deposited at a rate of about 65 A/min.

33. A method according to claim 1 wherein the said substrate is preheated in the range of 25° to 400° C. to adjust an optical transmission of said substrate at said wavelengths.

34. A method according to claim 1 wherein said amorphous hydrogenated carbon film having an optical transmission is annealed at a temperature of 100° to 400° C. to adjust said optical transmission.

35. A method according to claim 1 further including the step of patterning said amorphous hydrogenated carbon film by reactive ion etching in an oxygen plasma to form a patterned layer on said substrate.

36. A method according to claim 35 wherein said patterned amorphous hydrogenated carbon layer has a refractive indexes at 365 nm, 248 nm or 193 nm such that it can be used as a single layer attenuated phase shift mask at 365 nm, 248 nm or 193 nm wavelengths.

37. A method according to claim 35 wherein an optical density of said amorphous hydrogenated carbon layer at 365, 248 or 193 nm wavelengths is in the range of 1 to 3 so that it can be used as a conventional photolithographic mask at said wavelengths.

38. A method according to claim 1 wherein said amorphous hydrogenated carbon film is patterned by a 193 nm laser ablation process to form a patterned layer on said substrate.

39. A method according to claim 38 wherein a thickness of the said amorphous hydrogenated carbon layer and its refractive index are such that it can be used as a single layer attenuated phase shift mask at 365 nm, 248 nm or 193 wavelengths.

40. A method according to claim 38 wherein an optical density of said amorphous carbon layer at 365, 248 or 193 nm wavelengths is in the range of 1 to 3 so that it can be used as a conventional photolithographic mask at said wavelengths.

41. A method according to claim 1 further including exposing said work piece to light at a first wavelength selected from the group consisting of 365 nm, 248 nm and 192 nm; and inspecting said work piece using light having second wavelength of 488 nm.

42. A method according to claim 41 further including exposing said work piece to light at a first wavelength selected from the group consisting of 365 nm, 248 nm and 192 nm; and inspecting said work piece using light having a second wavelength of 488 nm.

43. A method according to claim 42, wherein said work piece is a phase shift mask used to form a pattern in a photoresist by exposing said photoresist to said first wavelength through said phase shift mask.

44. A method according to claim 41, wherein said work piece is a phase shift mask used to form a pattern in a photoresist by exposing said photoresist to said first wavelength through said phase shift mask.

45. A method according to claim 1 wherein said work is a phase shift mask used to form a pattern in a photoresist by exposing said photoresist to said first wavelength through said phase shift mask.

46. In a method forming a work piece for use as a photolithographic mask by depositing an amorphous hydrogenated carbon film onto a substrate comprising the steps of:

placing a graphite target and said workpiece in a sputter deposition chamber;

applying a voltage to said graphite target;

directing at a graphite target a particle beam to reactively sputter deposit graphite from said target onto said substrate as an amorphous hydrogenated carbon film while:

argon is introduced into said deposition chamber at a flow rate of from about 1 to about 100 sccm;

hydrogen is introduced into said deposition chamber at a flow rate of about 1 to 100 sccm;

hydrocarbon and helium are introduced as a combined gas at a flow rate of from about 5 to about 100 sccm, where said combined gas contains from about 50% to about 99% helium to provide said amorphous hydrogenated carbon film with an optical transmission of 0.5% to 10% and a refractive index of 1.6 to 2.2 at the 365 nm, 248 nm or 193 nm wavelength and a transmissivity at the 488 wavelength.

47. A method according to claim 46 further including exposing said work piece to light at a first wavelength selected from the group consisting of 365 nm, 248 nm and 192 nm; and inspecting said work piece using light having a second wavelength of 488 nm.

48. A method according to claim 47, wherein said work piece is a phase shift mask used to form a pattern in a photoresist by exposing said phtotresist to said first wavelength through said phase shift mask.

49. A method according to claim 46, wherein said work piece is a phase shift mask used to form a pattern in a photoresist by exposing said photoresist to said first wavelength through said phase shift mask.

50. A method of forming a work piece depositing a diamond-like carbon film onto a substrate by sputter vapor deposition which comprises the steps of:

providing a sputter deposition chamber containing said substrate and a carbon target;

directing a beam at said carbon target to reactively deposit a amorphous carbon film from the graphite target onto the substrate while:

introducing argon into said deposition chamber at a flow rate of from about 1 to 100 sccm;

introducing hydrogen into said deposition chamber at a flow rate of from about 1 to about 10 sccm;

introducing acetylene diluted with helium, as a combined gas, at a flow rate of from about 5 to about 100 sccm, wherein said combined gas contains from about 50% to about 1% acetylene and from about 50% to about 99% helium to provide said diamond-like carbon film with optical transmission characteristics at a wavelength of 365 nm, 248 nm or 193 nm to make said workpiece suitable for use as a photolithographic mask.

51. A method according to claim 50, wherein said work piece is a phase shift mask used to form a pattern in a photoresist by exposing said photoresist to said first wavelength through said phase shift mask.

* * * * *